(12) United States Patent
Hendrix et al.

(10) Patent No.: US 8,154,886 B2
(45) Date of Patent: Apr. 10, 2012

(54) COMPACT FIBER PANEL WITH SLIDING TRAY HAVING REMOVABLE HOOD

(75) Inventors: Mark Hendrix, Richardson, TX (US); Stephen Watson, Richardson, TX (US); Chuck Mann, Omaha, NE (US)

(73) Assignee: CommScope, Inc. of North Carolina, Hickory, NC (US)

( * ) Notice: Subject to any disclaimer, the term of this patent is extended or adjusted under 35 U.S.C. 154(b) by 1049 days.

(21) Appl. No.: 12/056,989

(22) Filed: Mar. 27, 2008

(65) Prior Publication Data

US 2008/0239693 A1    Oct. 2, 2008

Related U.S. Application Data

(60) Provisional application No. 60/907,249, filed on Mar. 27, 2007.

(51) Int. Cl.
*H02B 1/20* (2006.01)
(52) U.S. Cl. .............. 361/826; 361/728; 361/730
(58) Field of Classification Search .......... 361/728, 361/730, 752, 796, 797, 800, 756, 727, 759, 361/825, 826
See application file for complete search history.

(56) References Cited

U.S. PATENT DOCUMENTS

| | | | |
|---|---|---|---|
| 5,119,459 A * | 6/1992 | Meyerhoefer et al. | 385/135 |
| 5,127,082 A * | 6/1992 | Below et al. | 385/135 |
| 5,332,179 A * | 7/1994 | Kuffel et al. | 248/74.3 |
| 5,632,457 A * | 5/1997 | Neely, Jr. | 248/69 |
| 5,898,129 A | 4/1999 | Ott et al. | |
| 6,263,141 B1 | 7/2001 | Smith | |
| 6,353,183 B1 | 3/2002 | Ott et al. | |
| 6,438,310 B1 | 8/2002 | Lance et al. | |
| D465,455 S * | 11/2002 | Schray | D13/123 |
| 6,504,988 B1 | 1/2003 | Trebesch et al. | |
| 6,591,051 B2 | 7/2003 | Solheid et al. | |
| 6,748,155 B2 | 6/2004 | Kim et al. | |
| 6,792,190 B2 | 9/2004 | Xin et al. | |
| 6,870,734 B2 | 3/2005 | Mertesdorf et al. | |
| 6,937,807 B2 | 8/2005 | Franklin et al. | |
| 6,944,383 B1 * | 9/2005 | Herzog et al. | 385/123 |
| 6,944,389 B2 | 9/2005 | Giraud et al. | |
| 6,968,111 B2 | 11/2005 | Trebesch et al. | |
| 7,031,588 B2 | 4/2006 | Cowley et al. | |
| 7,068,907 B2 | 6/2006 | Schray | |
| 7,079,744 B2 | 7/2006 | Douglas et al. | |
| 7,092,258 B2 * | 8/2006 | Hardt et al. | 361/826 |
| 7,120,348 B2 | 10/2006 | Trebesch et al. | |
| 7,200,316 B2 * | 4/2007 | Giraud et al. | 385/135 |
| 7,397,996 B2 * | 7/2008 | Herzog et al. | 385/135 |
| 7,715,681 B2 * | 5/2010 | Krampotich et al. | 385/135 |

* cited by examiner

*Primary Examiner* — Hung S Bui
(74) *Attorney, Agent, or Firm* — Muncy, Geissler, Olds & Lowe, PLLC

(57) ABSTRACT

A cable organization unit includes a housing. A tray is attached to the housing by at least one slide, and is movable between a first position and a second position relative to the housing. A hood is removably secured to the tray. A user may remove the hood from the tray to access adapters attached to a bulkhead on the tray. The tray may include a latch for securing the tray to the housing in the first position, and the hood may be removed from the tray while the tray is in the first or second positions. A retainer is optionally attached to the housing. The retainer includes an adjustable opening which may be reduced in size such that edges of the opening frictionally engage and hold a jacket of a cable passing therethrough.

21 Claims, 5 Drawing Sheets

COMPACT FIBER PANEL WITH SLIDING TRAY HAVING REMOVABLE HOOD

This application claims the benefit of U.S. Provisional Application No. 60/907,249, filed Mar. 27, 2007, the entire contents of which are herein incorporated by reference.

BACKGROUND OF THE INVENTION

1. Field of the Invention

The present invention relates to a cable organization unit. More particularly, the present invention relates to a cable organization unit, wherein connectors and cabling devices, such as spools, guides, clips, adapters and splice holders are mounted to a tray, and the tray may slide into and out of a housing.

2. Description of the Related Art

In communication cabinets and racks, a multitude of cables are interconnected to one another via splices and connectors (such as adaptors in the case of fiber optic cables). A cable organization unit having a sliding tray is a convenient way to mount cabling devices, such as splice holders, adaptors and slack storage devices (e.g., clips, guides, spools). The cabling devices may be mounted to the sliding tray in a highly organized fashion, and the cabling devices may be withdrawn from a housing, mounted to the rack or cabinet, via the sliding action of the tray to provide for easy access and manipulation of the cabling devices by a technician.

Such cable organization units are generally known in the background art and more details of such devices may be seen in U.S. Pat. Nos. 7,120,348; 7,079,744; 7,068,907; 6,968,111; 6,944,389; 6,937,807; 6,748,155; 6,591,051; 6,504,988; 6,438,310; and 6,263,141, each of which is herein incorporated by reference.

SUMMARY OF THE INVENTION

The Applicants have appreciated a need in the art for a cable organization unit which improves on one or more of the following attributes: (A) a removable hood mounted to the sliding tray to provide quick access to adapters mounted to a bulkhead; (B) a cable retainer system which provides slack on the tray to allow for tray movement; (C) a more compact overall size of the housing; (D) an increased density of cabling devices within the cable organization unit; (E) a more streamlined outer housing shell; and (F) a housing that can be mounted horizontally or vertically, as desired by the user.

The Applicants have also appreciated a need for a cable organization unit which is simple in design, rugged, more flexible in end uses, easier to manufacture and/or less expensive to manufacture.

It is an object of the present invention to address one or more of the Applicants' appreciated needs in the art.

These and other objects are accomplished by a cable organization unit which includes a housing. A tray is attached to the housing by at least one slide, and is movable between a first position and a second position relative to the housing. A hood is removably secured to the tray. A user may remove the hood from the tray to access adapters attached to a bulkhead on the tray. The tray may include a latch for securing the tray to the housing in the first position, and the hood may be removed from the tray while the tray is in the first or second positions. A retainer is optionally attached to the housing. The retainer includes an adjustable opening which may be reduced in size such that edges of the opening frictionally engage and hold a jacket of a cable passing therethrough.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF THE INVENTION

Figure 1:
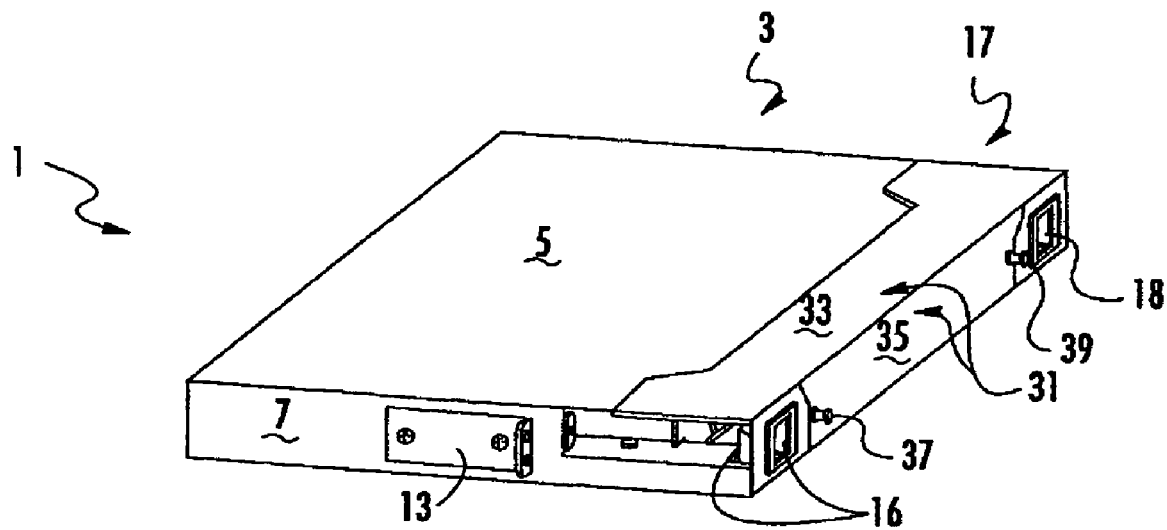
FIG. 1 is a front perspective view of a cable organization unit with a tray in a first (inserted) position, in accordance with the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "top", "lateral", "left", "right", "rear", "front" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features, e.g., the "top" becomes the "bottom" and the "left side" becomes the "right side". The device may be otherwise oriented (rotated 90 degrees or at other orientations) and the descriptors of relative spatial relationships used herein interpreted accordingly.

Figure 2:
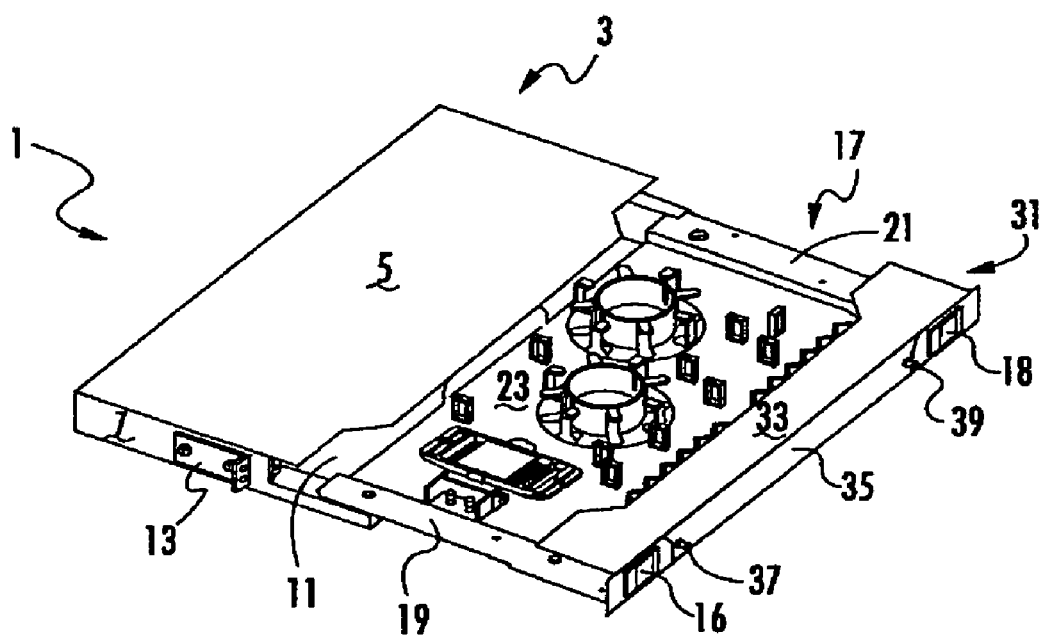
FIG. 2 is a front perspective view of the cable organization unit with the tray in a second (extended) position.
Figure 8:
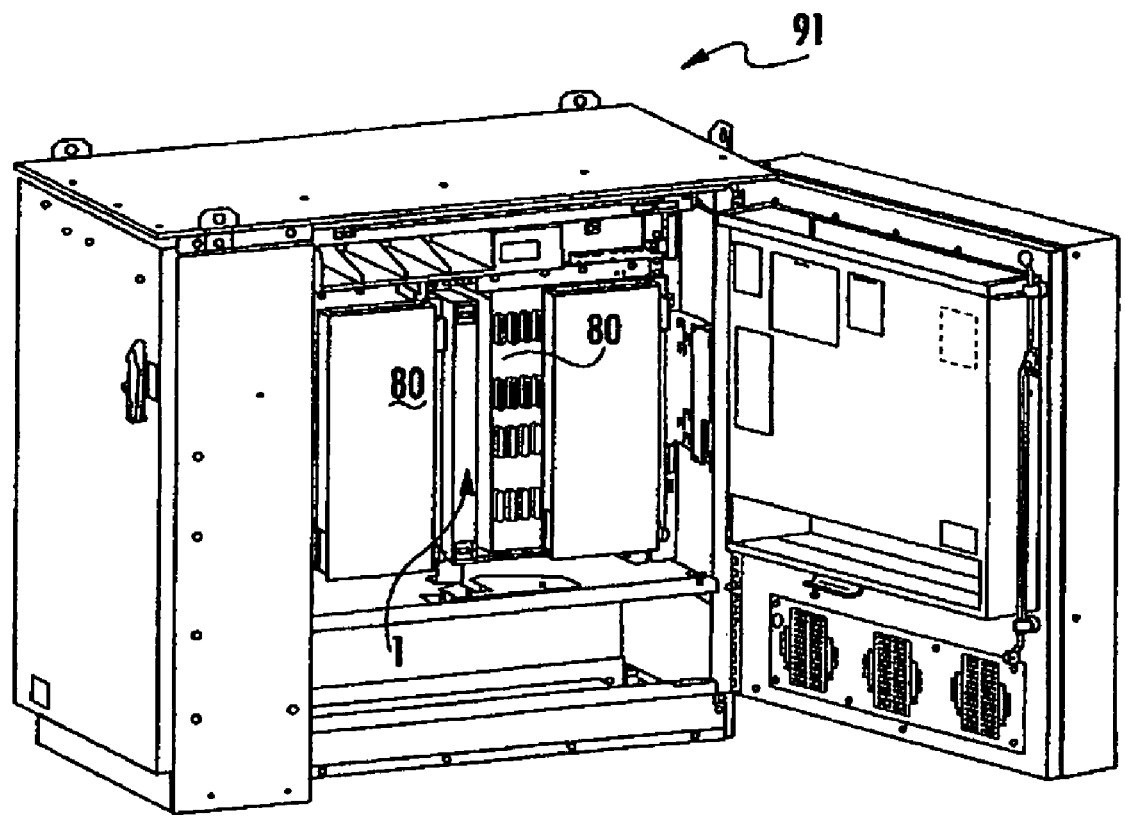
FIG. 8 is a perspective view of a cabinet including the cable organization unit located therein in a vertical orientation, with the tray in the first position, and the hood secured to the tray.
Figure 9:
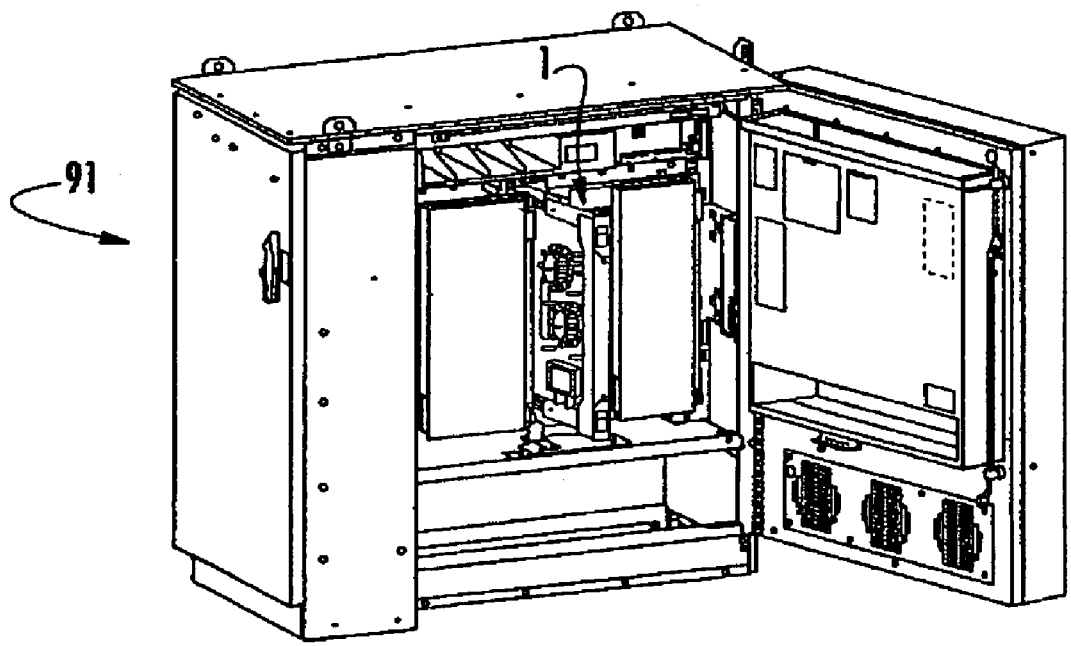
FIG. 9 is a view of the cabinet of FIG. 8, but with the tray in the second position.
Figure 10:
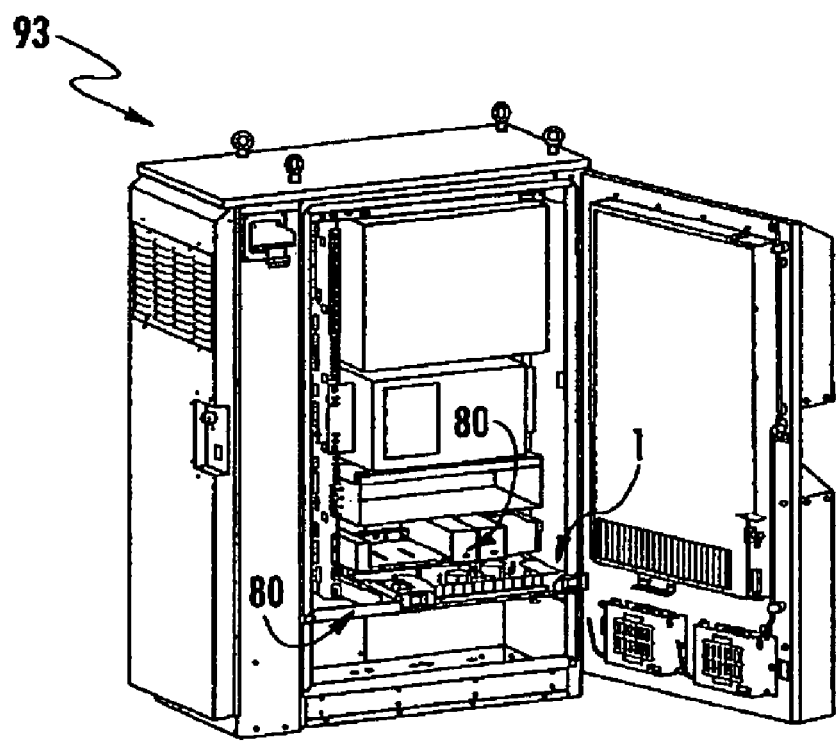
FIG. 10 is a perspective view of a different cabinet having the cable organization unit located therein in a horizontal orientation, with the tray in the second position, and the hood removed.

FIG. 1 is a front perspective view of a cable organization unit 1. The unit 1 includes a housing 3 which includes a top wall 5. A right side wall 7 and a left side wall 9 (FIG. 4) extend downwardly on opposing sides of the top wall 5. The housing 3 also includes a back wall (not shown) and a bottom wall 11 (FIG. 2). The right side wall 7 may include a first bracket 13 and the left side wall 9 may include a second bracket 15. The first and second brackets 13 and 15 include through holes to accept fasteners for attaching the housing 3 to a rack or cabinet (FIGS. 8-10).

A tray 17 is attached to the housing 3 by first and second slides 19 and 21 (FIG. 2). FIG. 1 shows the tray 17 in a first position relative to the housing 3, i.e., in an inserted position. FIG. 2 shows the tray 17 in a second position relative to the housing 3, i.e., in an extended position. The tray 17 may include first and second latches 16 and 18 to engage the housing 3 and secure the tray in the first position. The first and second slides 19 and 21 and the first and second latches 16 and 18 may be of a conventional design, such as those shown in the U.S. Pat. Nos. 7,120,348; 7,079,744; 6,968,111; 6,937,807; 6,748,155; 6,504,988 and 6,438,310 referenced in the background art.

Figure 5:
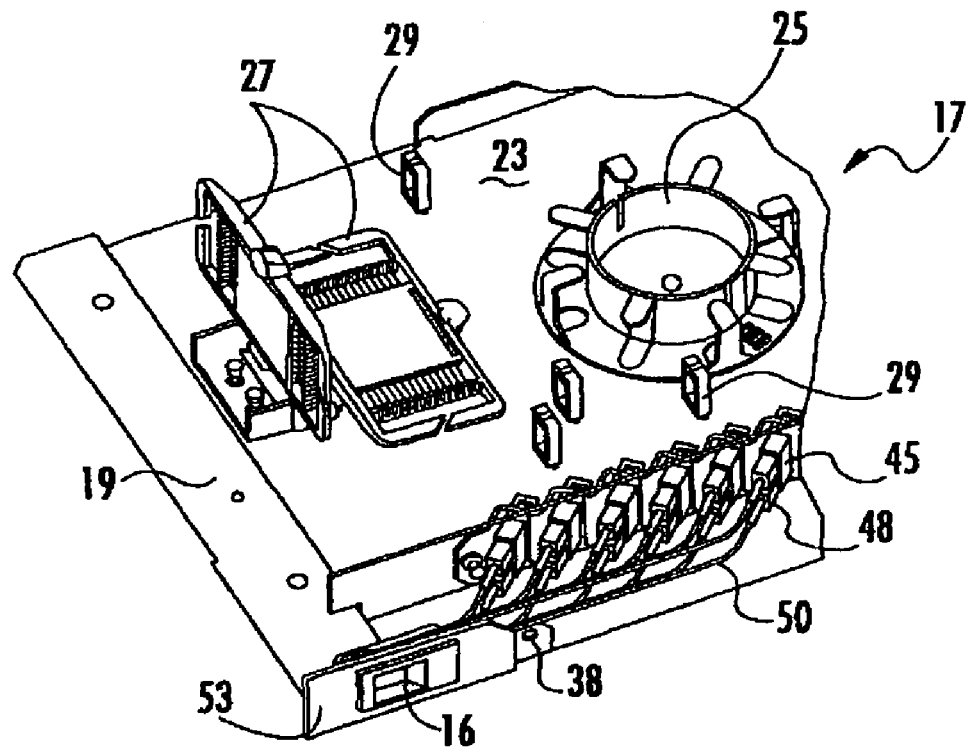
FIG. 5 is a close-up view of the cabling devices disposed on the tray.

As best seen in FIG. 2 and the close-up view of FIG. 5, a rear portion 23 of the tray 17 includes a plurality of cabling devices. The cabling devices may include such structures as a splice storage device 27, a cable clip 29, a curved cable guide (such as a spool 25 or slack wheel or slack guide) and other such structures for guiding and storing cable and for holding splices and/or connectors, while protecting the cables from damage and ensuring that the cables do not exceed their minimum bend radius.

As illustrated in FIG. 1, when the tray 17 is in the first position, the rear portion 23 resides beneath the top wall 5 of the housing 3. As illustrated in FIG. 2, when the tray 17 is in the second position, the rear portion 23 resides out from under the top wall 5 of the housing 3. When the tray 17 is in the second position, a technician may easily access the cabling devices to add or remove cables, splices, connectors, or other structures as needed to install, maintain or repair network connections.

FIG. 2 illustrates that a forward portion of the tray 17 includes a hood 31. The hood 31 includes a top panel 33 and a front panel 35. The front panel 35 is oriented in a first plane which is at an angle of approximately ninety degrees relative to a second plane containing the top panel 33. As best seen in FIG. 1, the top wall 5 of the housing 3 also resides approximately within the second plane.

Figure 3:
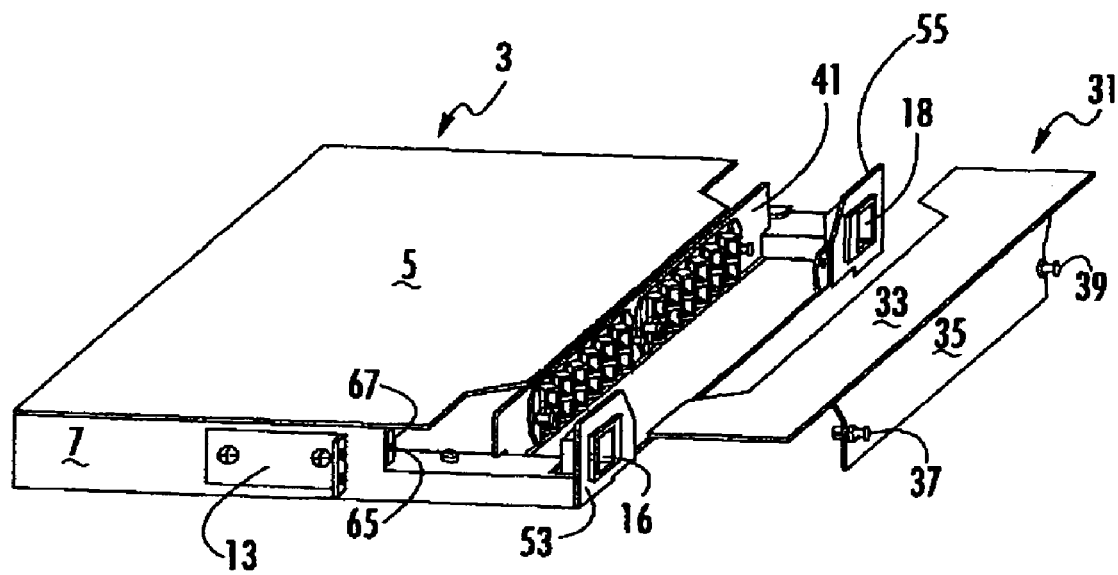
FIG. 3 is a front perspective view of the cable organization unit with the tray in the first position and a hood removed.
Figure 4:
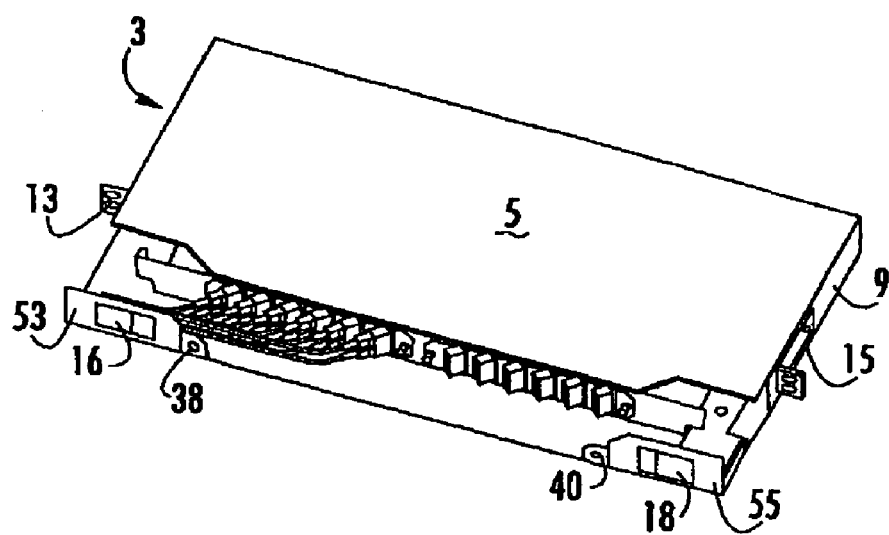
FIG. 4 is a view of the cable organization unit of FIG. 3, as viewed from a top and left side perspective.

The hood 31 is removably secured to the tray 17. FIGS. 1 and 2 illustrate the hood 31 in an engaged position, wherein the hood 31 is secured to the tray 17. FIG. 3 illustrates the hood 31 in a disengaged position, wherein the hood 31 is released from the tray 17. A user may remove the hood 31 from the tray 17 by applying finger force to first and second spring-actuated pin fasteners 37 and 39. The fasteners 37 and 39 are able to interlock within, and release from, first and second holes 38 and 40 formed in upturned tabs along a front edge of the tray 17 (FIG. 4). The hood 31 may be removed by pulling the hood 31 straight away from the tray 17 generally along a path within the second plane. The hood 31 may be removed while the tray 17 is in either the first or second position.

Figure 7:
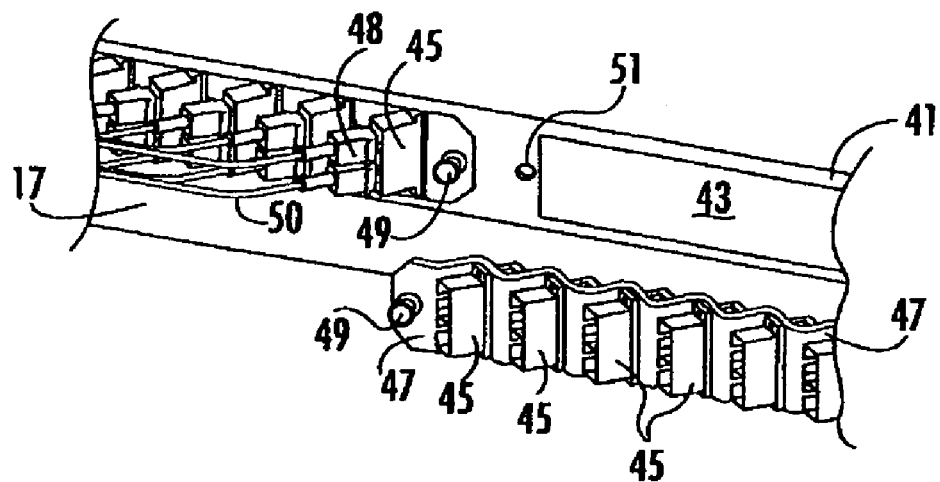
FIG. 7 is a close-up view illustrating a detachable bank of adapters and a bulkhead of the tray.

When the hood 31 is removed, a front side of a bulkhead 41, attached to the tray 17, is accessible to the user. As best seen in the close-up view of FIG. 7, the bulkhead 41 includes at least one opening 43 for receiving a bank of adapters 45 mounted in a bezel 47. Preferably, the bezel 47 presents the adapters 45 at an angle generally facing in a direction of a side of the tray 17. The angled orientation better accommodates a bend radius of cables 50 and makes the structure more compact.

Each bezel 47 includes two spring-actuated pin fasteners 49. The fasteners 49 may be constructed identically to the fasteners 37 and 39 of the hood 31. The fasteners 49 are sized to releasably engage/interlock within holes 51 formed in the bulkhead 41 to secure the bezels 47 to the bulkhead 41. Each bezel 47 may be removed to facilitate cleaning of the adapters 45 and connectors 48. Also a bezel 47 may be released from an opening 43, rotated one hundred eighty degrees, and reinstalled into the same opening 43, such that the adapters 45 are generally directed toward the opposite side of the tray 17.

As best seen in FIG. 3, the tray 17 may include right and left upturned ears 53 and 55 for supporting the first and second latches 16 and 18. The front panel 35 of the hood 31 resides between, and is aligned with, the right and left upturned ears 53 and 55, when the hood 31 is attached to the tray 17 (e.g., when the hood 31 is in the engaged position), regardless of the whether the tray 17 is in the first position or the second position.

When the hood 31 is in the engaged position and the tray 17 is in the first position, a rearward edge of the top panel 33 of the hood 31 is located adjacent to, or touching, the top wall 5 of the housing 3 (FIG. 1). In one embodiment, the top panel 33 of the hood 31 extends from a union of the top wall 5 and the right side wall 7 over to a union between the top wall 5 and the left side wall 9. Hence, the tray 17 is substantially enclosed by the housing 3 and the hood 31 when the tray 17 is in the first position and the hood 31 is in the engaged position.

When the hood 31 is in the engaged position and the tray 17 is in the second position, the rearward edge of the top panel 33 of the hood 31 is distanced from the top wall 5 of the housing 3. In this combined position, as illustrated in FIG. 2, a technician can easily access the cabling devices on the rear portion 23 of the tray 17.

The removable hood 31 provides several advantages. Often, a technician only needs access to the cabling devices 25, 27, 29 on the rear portion 23 of the tray 17. In such instances, there is no need to access the front portion of the adapters 45. Hence, the hood 31 may remain the engaged position during the servicing. This prevents the cables 50, exiting connectors 48, from "springing" out, under their natural resiliency, and potentially being snag against adjacent objects when the tray 17 is returned to its first position within the housing 3. In other words, the hood 31 acts as a retaining cap for the cables 50.

Also, the front face of the adapters 45 on the bulkhead 41 can be accessed by a technician without having the tray 17 withdrawn from its secured first position within the housing 3. Often times, the technician need only change out a connector 48 mounted within an adapter 45, and there is no need to withdraw the tray 17 from the housing 3 to perform this task. Whenever the tray 17 is pulled out from the housing 3 to its second position, cables 52 entering and exiting the tray 17 must move and there is a risk of binding up one or more of the cables and unplugging a connection or damaging a cable by exceeding its minimum bend radius, tearing a cable's jacket against a sharp object, etc. Such circumstances will be further described in conjunction with FIG. 6 below.

Figure 6:
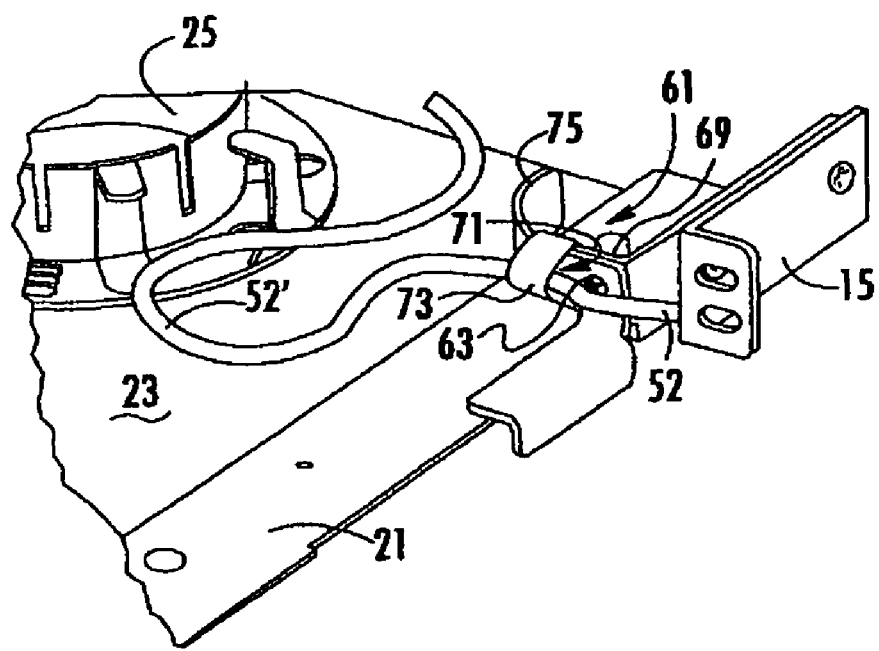
FIG. 6 is a close-up view of a cable retainer attached to the housing.

FIG. 6 illustrates a retainer 61 attached to the housing 3. The retainer 61 may be attached to the housing 3 using a fastener 63 attached to a threaded through hole 65 formed in a right side retainer tab 67 (FIG. 3) and/or a left side retainer tab 69 (FIG. 6), depending upon which side or sides of the tray 17 will have a cable 52, or cables, passing to the cabinet or rack.

The retainer 61 includes an adjustable opening 71 which may be reduced in size such that edges of the opening 71 may frictionally engage a jacket of a cable 52 passing therethrough. In one embodiment, the retainer 61 includes a flexible strap 73 having a hook and loop locking system, such as is commonly known as VELCRO®. However, the retainer 61 could alternatively include a ratcheting tie, or other type of vise gripping device. The retainer 61 also includes a curved guide 75 adjacent to the opening 71.

In operation, the cable 52 will have a slack portion 52' provided on the rear portion 23 of the tray 17. The slack portion 52' will allow the tray 17 to be moved between the first and second positions relative to the housing 3. In other words, the cable 52 does not move on the right-hand side of the retainer 61 (as illustrated in FIG. 6), while the tray is moving between the first and second positions, only the slack portion 52' on the left-hand side of the retainer 61 moves.

The slack portion 52' may occur on the rear portion 23 of the tray 17 under different circumstances. In one embodiment, the slack portion 52' occurs when the tray 17 is in the first position and the slack portion 52' is reduced when the tray 17 is moved to the second position. In another embodiment, the slack portion 52' occurs when the tray 17 is in the second position and the slack portion 52' is reduced when the tray 17 is moved to the first position. In yet another embodiment, the slack portion 52' occurs when the tray 17 is between the first and second positions and the slack portion 52' is reduced when the tray 17 is moved to the first position and is reduced when the tray 17 is moved to the second position.

In accordance with the embodiments of the present invention, a cable organization unit 1 is provided which exhibits a high product density that allows for fiber splicing, routing, slack storage, and termination of a large number of fiber, such as 24 fibers, in a 1U rack mountable package. The cable organization unit 1 may be mounted in a variety of orientations. For example, FIG. 8 illustrates the cable organization unit 1 mounted vertically within a cabinet 91. In FIG. 8, the tray 17 is in the first position and the hood 31 is attached to the tray 17. FIG. 9 is a view of the same cabinet 91 depicted in FIG. 8, but illustrates the tray 17 in the second position, extending from the housing 3, with the hood 31 still attached to the tray 17.

FIG. 10 illustrates the cable organization unit 1 mounted in a horizontal orientation within a different cabinet 93. In FIG. 10, the tray 17 is in the second position and the hood 31 is removed from the tray 17.

One feature of the present invention becomes apparent in FIGS. 8-10, with the compact nature of the mounting of the cable organization unit 1, adjacent structures 80 are closely positioned to the top and bottom of the cable organization unit 1. The closeness of the adjacent structures 80 would prevent any pivoting or swinging action of a hood 31, if that hood 31 were hinged to the tray 17. However, the hood 31 of the present invention can be completely removed from the tray 17, by releasing the fasteners 38 and 40 and pulling the hood 31 away from the tray 17, even while the tray 17 remains latched in the first position. Hence, the hood 31 can be removed and the adapters 45 may be accessed without unlatching and withdrawing the tray 17 from the housing 3, despite the compact mounting of the cable organization unit 1 in close proximity to the adjacent structures 80.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

We claim:

1. A cable organization unit comprising:
a housing including a top wall;
a tray attached to said housing by at least one slide, such that said tray is movable relative to said housing between a first position and a second position, wherein a portion of said tray resides beneath said top wall of said housing when said tray is in said first position and said portion of said tray resides out from under said top wall when said tray is in said second position; and
a hood removably secured to said tray, wherein said hood has an engaged position wherein said hood is secured to said tray and a disengaged position wherein said hood is released from said tray and a user may remove said hood from said tray to provide access to said tray, and wherein at least one portion of said hood is located adjacent to said top wall of said housing when said hood is in said engaged position and said tray is in said first position.

2. The cable organization unit of claim 1, wherein said at least one portion of said hood is distanced from said top wall of said housing when said hood is in said engaged position and said tray is in said second position.

3. The cable organization unit of claim 1, wherein said tray includes a latch for securing said tray in said first position, and wherein said hood may be moved to said disengaged position and removed from said tray while said tray remains secured to said housing in said first position.

4. The cable organization unit of claim 1, further comprising:
a bulkhead for holding adapters mounted to said tray, and wherein a forward side of said bulkhead is accessible to a user when said hood is removed from said tray.

5. The cable organization unit of claim 1, wherein said tray is substantially enclosed by said housing and said hood when said tray is in said first position and said hood is in said engaged position.

6. The cable organization unit of claim 1, wherein said hood includes a top panel and a front panel, and wherein an edge of said top panel is located adjacent said top wall of said housing when said hood is in said engaged position and said tray is in said first position.

7. The cable organization unit of claim 6, wherein said front panel is oriented in a first plane which is at an angle of approximately ninety degrees relative to second plane containing said top panel.

8. The cable organization unit of claim 7, wherein said top wall of said housing also resides approximately within said second plane.

9. The cable organization unit of claim 6, wherein said housing further includes a left side wall and a right side wall extending downwardly on opposing sides of said top wall, and wherein said edge of said top panel extends from a union of said top wall and said right side wall over to a union between said top wall and said left side wall when said hood is in said engaged position and said tray is in said first position.

10. The cable organization unit of claim 6, wherein said tray includes a front right upturned ear and a front left upturned ear, and wherein said front panel of said hood resides between said front right upturned ear and said front left upturned ear when said hood is in said engaged position.

11. The cable organization unit of claim 10, wherein at least one of said front right upturned ear and said front left upturned ear supports a latch for holding said tray in said first position.

12. The cable organization unit of claim 1, wherein said hood is retained in said engaged position by at least one spring-actuated pin fastener, which is released by a user's finger force.

13. The cable organization unit of claim 1, further comprising:
a cabling device attached to said tray, wherein said cabling device is selected from the group consisting of: a spool, a splice storage device, a cable guide, and a cable clip.

14. A cable organization unit comprising:
a housing including a top wall;
a tray attached to said housing by at least one slide, such that said tray is movable relative to said housing between a first position and a second position, wherein a portion of said tray resides beneath said top wall of said housing when said tray is in said first position and said portion of said tray resides out from under said top wall when said tray is in said second position;
a hood removably secured to said tray, wherein said hood has an engaged position wherein said hood is secured to said tray and a disengaged position wherein said hood is released from said tray and a user may remove said hood from said tray to provide access to said tray, and wherein at least one portion of said hood is located adjacent to said top wall of said housing when said hood is in said engaged position and said tray is in said first position; and
a retainer attached to said housing, wherein said retainer includes an adjustable opening which may be reduced in size such that edges of said opening may frictionally engage and hold a jacket of a cable passing therethrough.

15. The cable organization unit of claim 14, wherein said retainer includes a flexible strap having a hook and loop locking system.

16. The cable organization unit of claim 14, wherein said retainer includes a curved guide adjacent to said opening.

17. The cable organization unit of claim 14, further comprising:
a cable passing through said opening in said retainer and a jacket of said cable being frictionally engaged by said edges of said opening of said retainer.

18. The cable organization unit of claim 17, wherein slack occurs in a portion of said cable residing on said tray when said tray is in said first position and the slack in said cable is reduced when said tray is moved to said second position.

19. The cable organization unit of claim 17, wherein slack occurs in a portion of said cable residing on said tray when said tray is in said second position and the slack in said cable is reduced when said tray is moved to said first position.

20. The cable organization unit of claim 17, wherein slack occurs in a portion of said cable residing on said tray when said tray is between said first position and said second position and the slack in said cable is reduced when said tray is moved to said first position and is reduced when said tray is moved to said second position.

21. The cable organization unit of claim 14, further comprising:
a cabling device attached to said tray, wherein said cabling device is selected from the group consisting of: a spool, a splice storage device, a cable guide, and a cable clip.

* * * * *